United States Patent [19]
Simmonds

[11] 3,944,914

[45] Mar. 16, 1976

[54] FAULT DETECTION METHOD AND APPARATUS FOR MULTICONDUCTOR CABLES

[75] Inventor: James F. Simmonds, Canoga Park, Calif.

[73] Assignee: Perkins Research and Manufacturing Co., Canoga Park, Calif.

[22] Filed: Apr. 29, 1974

[21] Appl. No.: 464,933

[52] U.S. Cl.............. 324/51; 179/175.3 F; 324/52
[51] Int. Cl.² G01R 31/02; G01R 31/08; H04B 3/46
[58] Field of Search............ 324/51, 52, 54, 60 CD, 324/66; 179/175.3 F

[56] References Cited
UNITED STATES PATENTS

| | | | |
|---|---|---|---|
| 1,906,466 | 5/1933 | Haskins | 324/60 CD |
| 3,290,586 | 12/1966 | Anderson | 324/52 |
| 3,452,272 | 6/1969 | Collins et al. | 324/52 X |
| 3,559,055 | 1/1971 | Thompson | 324/66 |
| 3,576,490 | 4/1971 | Nishino | 324/52 X |
| 3,800,216 | 3/1974 | Hamilton | 324/52 |

*Primary Examiner*—Gerard R. Strecker

[57] ABSTRACT

Method and apparatus are provided for detecting the existence of physical faults such as shorts, grounds, opens, crosses, splits and punchbacks in a multiconductor cable composed of paired conductors. Such paired conductor cables are typically used in telephone transmission networks. Each of the conductors within the cable exhibit a distributed capacitance with respect to a metallic cable sheath and with respect to all of the other conductors. The various cable faults mentioned above are quickly and effectively detected by selectively conducting each pair of conductors to a test circuit. The test circuit periodically electrically charges and discharges each of the lines and in so doing provides a measurement of the distributed capacitance of each pair which may be compared with corresponding capacitance measurements obtained from the other pairs of conductors of the same cable. The comparative measurement quickly reveals any faults in the various conductors.

7 Claims, 5 Drawing Figures

FAULT DETECTION METHOD AND APPARATUS FOR MULTICONDUCTOR CABLES

BACKGROUND AND PRIOR ART

The present invention relates to cable testing equipment for use in the telecommunications field.

There is a continuing need in the telecommunications and CATV industry for cable testing equipment that permits rapid and low-cost identification of physical cable conductor faults. In the typical telephone cable, there are groups of telephone pairs, each pair comprising a ring and tip conductor. These conductors are insulated from each other and from all other conductors in the cable. A typical telephone cable may vary in size from approximately 25 pairs to as many as 2700 pairs or more.

When a new telephone cable is installed, and before service can be connected, it is common in the industry to test all of the pairs in the cable to determine if there are any physical faults in the pairs. After such initial testing, the cable may be further tested for signal transmission characteristics. Because of the large number of conductors within each cable, it will be appreciated that test equipment which can rapidly examine and simply and quickly indicate the existence and type of fault in a particular pair can provide a considerable reduction in installation and maintenance costs.

While there are numerous types of faults which may exist due to defects in the manufacture of the cable or in the cable installation, typical cable pair faults are: (1) shorts — the conductors of a given pair have an electrical contact between them; (2) grounds — one conductor of one pair is in electrical contact with ground; (3) open-one-side — one conductor of one pair lacks continuity to the end of the cable; (4) open-both-sides (tip and ring) — both conductors of one pair lack continuity to the end of the cable; (5) split — one conductor of one pair is improperly spliced with a conductor of a second pair (i.e., the tip, for example, of pair one is improperly connected to the tip or ring conductor of another pair); (6) cross — one conductor of one pair is in electrical contact with a conductor of a different pair; and (7) punchbacks (sometimes called buttbacks) — both conductors of one pair in one section of a cable have been spliced back to the conductors of another pair in the same section of cable rather than in the next adjacent cable section.

One common construction technique in the telephone industry for the installation of a new telephone cable is to commence cable laying at the central office. In the central office, the cable pairs are terminated at the main distribution frame. Successive sections are then spliced at increasingly remote locations from the central office. These splices are commonly made in underground manholes provided for such purpose.

The above described faults may appear in either the cable sections, due to defective manufacture or damage caused by "pulling in" of the section, or in improper splices between adjacent sections. To locate such faults, a testing procedure has been established. By this procedure, after several sections of the new cable have been placed, each successive section and the splices therebetween are tested for physical faults.

There is now known in the art a device that performs a rapid test of pairs during installation generally in the manner described above. This device is capable of identifying the existence of DC faults such as shorts and grounds. It is further possible to identify the existence of opens, splits, crosses and punchbacks utilizing the capacitance of the cable pair.

In operation, a plurality of cable pairs are connected to the test instrument from the main distribution frame through test connectors commonly referred to as "front top shoes." Such shoes will typically connect 50 pairs to the test instrument at once. Through the provision of a pair selector switch, anyone of these pairs may then be electrically connected to the test instrument for fault testing. Through the manipulation of various knobs and levers, different test circuits may be sequentially connected to the pair under test to determine if a fault exists and to identify the type of fault, if any. The existence of a fault is indicated by visual monitoring of a meter while a test sequence is performed.

Basically, the prior art apparatus operates to selectively monitor the distributed capacitance of each pair and to compare the results with all other pairs of conductors. To accomplish this, the apparatus may include a cable pair selector switch, a relay circuit, a timing circuit, a source of DC voltage (usually a battery for portability), and a meter circuit. The device may further be provided with a footage capacitance measuring circuit so that the location, as well as the identity, of certain types of faults such as opens, punchbacks and splits may be ascertained.

Although such devices operate satisfactorily for cables of considerable length where the distributed capacitance is large and readily measured, problems have been encountered when testing shorter cables. More particularly, as a pair capacitance decreases, i.e., the length of the cable becomes relatively small, the interaction between the cable capacitance and the testing circuit is not sufficiently pronounced to provide good, easily read test results. Whereas, the prior art device has functioned satisfactorily when at least ten thousand feet of cable is connected to the test set, where the cable has a lesser length, the device is increasingly ineffective. For example, at a length of 500 feet or less, it is not possible to make a satisfactory fault test.

SUMMARY OF THE INVENTION AND ITS OBJECTIVES

In light of the above-described disadvantage of the prior art test apparatus it is an object of the present invention to provide an improved test apparatus and method for identifying cable pair faults in cables having relatively short lengths.

It is a further object to provide such test apparatus which is portable and which does not require a large, cumbersome, expensive battery in order to accomplish such testing.

Generally, the present invention comprises a portable battery-powered test apparatus for identification of physical faults such as shorts, grounds, opens, crosses, splits, and punchbacks, including means for physically connecting a plurality of cable pairs to the test apparatus, means for selecting a particular cable pair for test, timing circuit means for controlling the relay circuit means and means responsive to the relay means for applying amplified signal pulses to the conductor pair in rapid succession, meter circuit means, and means for manually selecting the amplification in accordance with the length of cable pair under test.

The device may further include a capacitance measuring circuit having manually adjustable variable capacitor banks calibrated to provide a visual indication of the length of the cable pair to the fault, that is the length between the test set and a certain physical fault. This measurement is made by comparing the measured cable pair capacitance against the banks of known capacitors which have been calibrated in terms of standard cable pair capacitance per unit of length.

These and further objects and various advantages of the apparatus and method for detecting faults in cable pairs according to the present invention will become apparent to those skilled in the art from a consideration of the following description of an exemplary embodiment thereof.

BRIEF DESCRIPTION OF THE DRAWINGS

Reference may be made to the appended sheets of drawings in which.

DESCRIPTION OF THE PREFERRED EMBODIMENT

Figure 1:
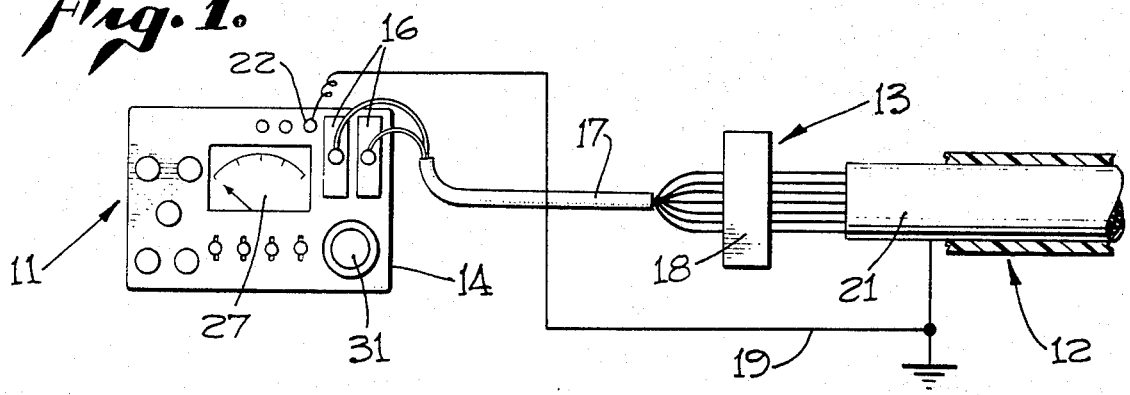
FIG. 1 is a diagrammatic illustration of an exemplary embodiment of the test apparatus constructed in accordance with the present invention used for the identification and detection of physical cable faults.

Referring now to FIG. 1 of the drawings, one particular and preferred embodiment of the present invention includes a test instrument for detecting and identifying faults in a telephone transmission cable 12. Cable 12 is of the type having a multiplicity of paired conductors indicated at 13 wherein any given pair is composed of a tip conductor and a ring conductor for a standard telephone installation. In general, the present invention as provided by instrument 11 is an improvement over prior art devices in that the present apparatus is capable of identifying and locating conductor faults even in relatively short lengths of cable.

Generally, the instrument 11 is packaged in a suitable portable transit instrument case 14 and includes an internal battery source of approximately 22 volts. One or more multiple pair connectors 16 are mounted on the face of the instrument and these connectors extend internally of the instrument to a cable pair selector switch described more fully hereinafter for applying each pair of conductors in succession to an internal test circuit. Connectors 16 extend through a short section of test cable 17 to the test connector 18 commonly termed the "front tap shoes" which in turn is connected to the multiple conductor pairs 13 of cable 12. A ground lead 19 is also provided between the surrounding metal sheath 21 of cable 12 to a ground terminal 22 of the instrument.

Figure 2:
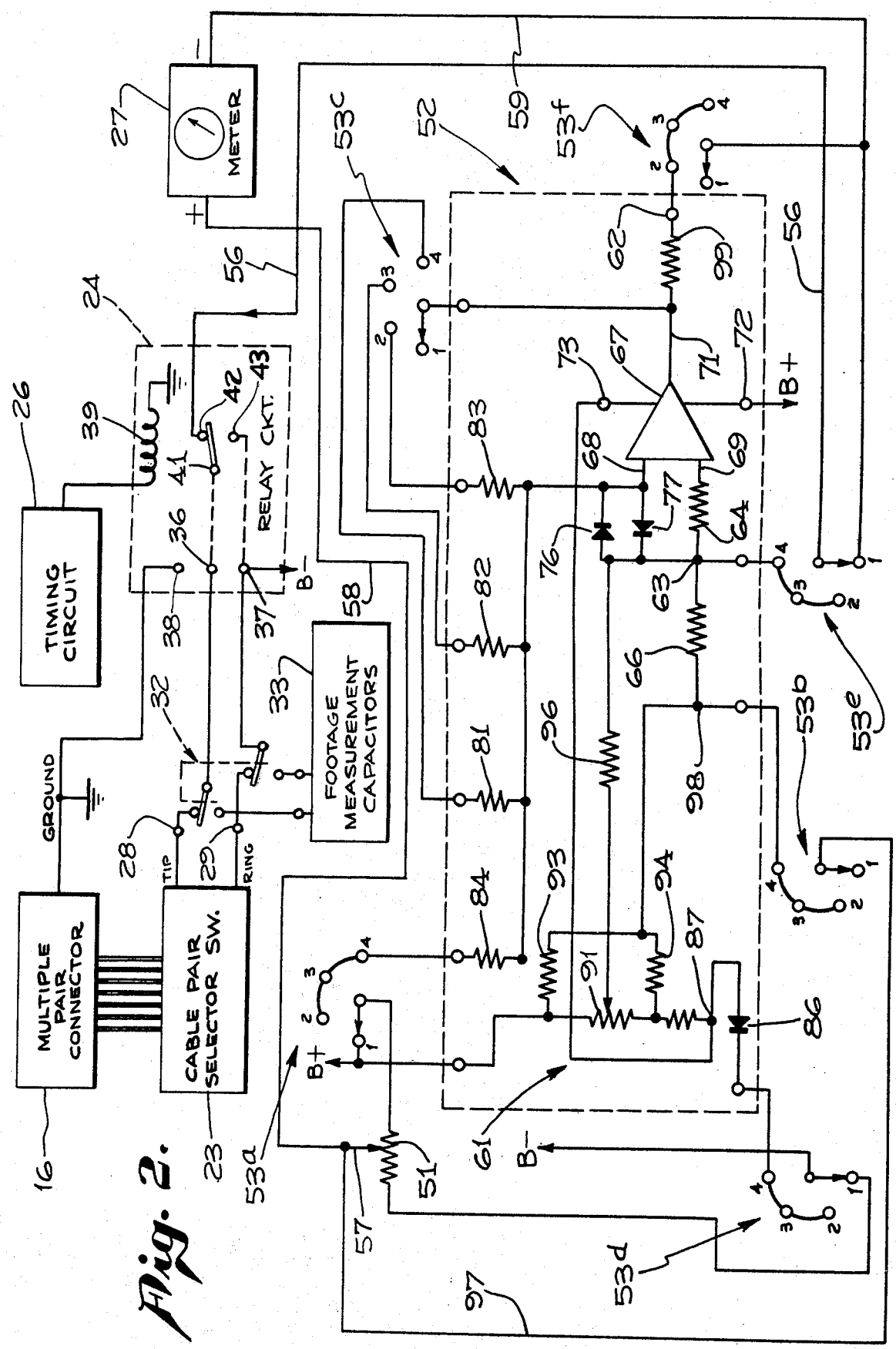
FIG. 2 is a detailed circuit diagram of the test apparatus shown in FIG. 1.

With reference to FIG. 2 which shows the internal testing circuitry of instrument 11, the testing operation generally provides for the application of a periodic pulse signal or periodic voltage pulse to each pair of connectors selected by a cable pair selector switch 23. The periodic pulses are provided by a relay circuit 24 which is periodically energized or actuated by a timing circuit 26. Since each of the conductor pairs of the cable constitutes a capacitor because of the distributed capacitance along each conductor between adjacent conductors and between the metal sheath 21, it is possible to monitor the characteristics of the cable capacitance in response to the periodic pulsing. The effect of the pulsing is to periodically charge and then discharge the distributed capacitance associated with each pair of conductors while the average current flow associated with this charging and discharging is registered by a meter 27. The current flow during the charging part of the cycle provides a meter reading proportional to the current flowing into the cable pair which in turn is dependent upon the amount of distributed capacitance thereof.

Furthermore, the test instrument provides for connecting the pulsing circuit to the cable pair in several different ways so as to obtain measurements of different distributed capacitance parameters exhibited by the cable conductors. By measuring each of these several different capacitance characteristics for each of the cable pairs 13 and comparing the results therebetween, it is possible to quickly and effectively identify certain types of cable faults such as the above-defined shorts, grounds, opens, crosses, splits and punchbacks.

More particularly with reference to FIG. 2, the output of cable pair selector switch 23 provides common tip and ring terminals 28 and 29 which are connected to a selected pair of tip and ring conductors from connector 16 and hence from cable 12 by manually operating a knob 31 on instrument 11 which operates switch 23. Terminals 28 and 29 are thereafter connected through a key switch 32 which provides for optional connection of relay circuit 24 to either the tip and ring terminals from the cable or to a bank of footage measurement capacitors 33 as illustrated. Accordingly, key switch 32 may be alternately switched between the capacitance associated with a selected cable pair and the capacitance available from the bank of measurement capacitors 33 for comparison. As described more fully herein, a comparison between the effective capacitance of a given cable pair and a known standard capacitance available at capacitors 33 enables the operator to establish the length of cable to a particular, identified fault.

Thus, with the key switch 32 in the position shown, relay circuit 24 is provided with three lines corresponding to the tip and ring conductors from a selected cable pair and the ground conductor from the cable sheath. These lines are connected to the relay circuit at terminals 36, 37 and 38.

Relay circuit 24 includes a set of relay contacts operated by a relay coil 39 which is in turn connected to timing circuit 26. These relay contacts may be provided by a common pole contact 41 which is normally closed on contact 42 and a normally open contact 43. This set of relay contacts are adapted to be connected to the cable terminals 36, 37 and 38 in several different ways to provide the different capacitance measurements more fully described herein in connection with FIGS. 3a through 3c. For the present purposes, the connection of the relay contacts is illustrated for one of the principal test set-ups in which pole terminal 41 is connected to the tip conductor at terminal 36 while the normally open contact 43 is connected to the ring conductor through terminal 37, while the ground terminal 38 remains unconnected.

Timing circuit 26 which may be of any conventional construction provides for periodically energizing or pulsing relay coil 39 in order to cause periodic actuation of the set of relay contacts 41 – 43. Accordingly, circuit 26 may be provided by a free running multivibrator or other equivalent circuitry. It has been found that the frequency at which the relay circuit 24 is operated is preferably in the neighborhood of 23 cycles per second. This cyclical rate of operation is determined primarily by the desire to avoid any harmonic relationship with the presence of stray 60 cycle power current typically encountered on or adjacent to telephone cable installations and by the desire to operate the relay at a sufficiently low speed to ensure a long, reliable operating life.

The relay contacts are also connected to meter 27 through a source of battery potential, in this instance indicated by the B+ and B− notation. The battery potential provides the periodic charging of the cable pair and this potential is selectively applied either directly through meter 27 and the relay 24 contacts through a potentiometer 51 or indirectly through a special pulse amplification circuit 52 wherein these alternative operations are selectively provided by setting a multiple pole-multiple position switch 53a, b, c, d, e and f.

Relay 24 together with timing circuit 26, meter 27, the battery voltage supply and amplification circuit 52 provide a test circuit for periodically charging and discharging the distributed capacitance associated with the cable conductors. In general, the magnitude of the distributed capacitance will determine the amount of current flow into the cable conductors in response to an applied charging voltage. The charging period occurs when contact 42 of the relay 24 is connected as shown to pole contact 41 so as to apply a portion of the battery voltage across the tip and ring conductors. When the relay is periodically actuated to cause pole contact 41 to close on normally open contact 43, the distributed capacitance of the cable pair is discharged. As described more fully herein, meter 27 registers an average level of magnitude of charge on the pair of conductors lying somewhere between a zero charge and the assumed peak charge. The actual fluctuations of the current flow associated with the charging of the lines occur too rapidly to be followed by meter 27 and thus only an average value is registered. However, this average level registered by the meter is a entirely satisfactory indication of abnormal cable conditions, that is an abnormal deviation in the distributed capacitance of one cable pair versus the remaining cable pairs.

The multipole-multiposition switch 53a − 53f provides a first setting shown as the number one position for enabling measurements on relatively long stretches of cable, e.g., cable installations of 10,000 feet or more. In this first position, B+ is applied through the number one position of switch section 53a through one side of potentiometer 51 and through a variable wiper arm 57 over a connecting line 58 to the positive terminal of meter 27. The negative terminal of meter 27 is connected over line 59 through the number one position of switch section 53e to line 56 and from there to contact 42 of relay 24 as shown. Potentiometer 51 is adjustable at the control panel of instrument 11 for providing a variable potential for supplying the charging voltage through meter 27 and through the contacts of relay 24 to the tip and ring conductors of the selected cable pair.

For shorter lengths of cable, three range settings are provided for switch 53a − f indicated as positions number two, number three and number four. These three range positions provide fundamentally the same circuit operation except for a difference in gain for the amplification circuit 52.

When switch 53a − f is switched from the number one position, it will be observed that potentiometer 51 is removed from the circuit and that the charging voltage for application through meter 27 and relay 24 is derived through amplification circuit 52 from a resistive voltage divider network 61. This change is effected by switch sections 53a and 53d. Also, in switch positions two through four, line 59 from meter 27 is disconnected from the line 56 which extends to the relay and in place of this connection line 59 is connected to the output terminal 62 of amplification circuit 52 while line 56 to the relay is connected to an input circuit to the amplifier at a junction 63 between resistors 64 and 66 as shown. The result of this switching operation is to charge the conductor pairs through meter 27 by means of an amplified voltage derived from the same battery source B+ − B− to achieve an average level of deflection on meter 27 suitable for testing shorter cable lengths.

Amplification circuit 52 may be provided by an operational amplifier 67 having first and second inputs 68 and 69, an output 71 and plus and minus voltage supply terminals 72 and 73. The amplifier 67 is connected in a non-inverting mode with the base or lower input 69 connected to line 56 through resistor 64 at junction 63. Resistor 64 together with the parallel and oppositely poled diodes 76 and 77 serve to protect the operational amplifier 67 against excessive voltage swings.

The gain of the amplification circuit is controlled by varying the feedback resistance across operational amplifier 67 through switch section 53c and the three different feedback resistances 81, 82 and 83 corresponding to the different gain positions number two, number three and number four of the switch setting. A certain amount of continuously variable feedback resistance is available for adjusting the circuit gain between one end of potentiometer 51 and wiper arm 57 which is in feedback around the amplifier circuit by means of the connection through resistor 84, switch section 53a, through potentiometer 51 to wiper arm 57 and from there through meter 27 to the amplification circuit output terminal 62 through switch section 53f.

Switch section 53d applies negative voltage B− to the negative supply terminal 73 of the operational amplifier 67 through a diode 86. Also, switch section 53d completes the negative side of the divider network 61 at terminal 87 when the switch is in positions two through four.

Divider network 61 includes a potentiometer 91 and a resistor 92 which together with resistors 93, 94 and 96 provide a means of compensating for any offset voltage exhibited by operational amplifier 67. In the absence of such a compensating network, amplifier 67 may produce a slight output voltage even though the input signal is zero. By adjusting potentiometer 91, this network provides for eliminating this offset voltage to zero the meter reading.

Resistor 66 provides a fixed load across which a suitable charging voltage can be developed. In this special amplification circuit, the output terminal 62 thereof may be considered to remain at or near a reference ground because of a connecting line 97 connecting one side of meter 27 through line 58, to a junction 98 through switch section 53b so that junction 63 exhibits the amplified voltage swings developed by the amplification circuit. This amplified voltage signal is thus available over line 56 through switch section 53e for application to the cable pair by the contacts of relay 24. Resistor 99 adjacent the output of the amplification circuit serves to provide a signal to the meter 27 which exhibits a linear response to the input to the amplifier.

The test instrument may be utilized in the following manner to identify and locate faults within the multiconductor cable. With further reference to FIG. 1, initially the connector 18 or "front tap shoe" is connected to the cable pairs 13 and the test cable 17 from this connector is joined to the test instrument through suitable plugs to connectors 16 mounted on the instrument's face plate. Connectors 16 may include 25 pair connectors each to provide a total of 50 pair connections between the cable 12 and the test instrument. Knob 31 is connected to the cable pair selector switch for rapidly and sequentially switching between any given conductor pair available at connectors 16. The cable pair selector switch 23 may be provided with 25 positions and an independent key switch for selecting one or the other of the two groups of 25 pairs each available at the connector 16. Alternatively, the selector switch 23 and its associated control knob 31 may provide for the full compliment of 50 positions for individually selecting each of the available 50 conductor pairs.

Having performed this preliminary hookup, the cable pair selector switch 23 is manually moved to the first pair of conductors to be tested. Generally, the craftsman will ordinarily have a general idea as to the length of cable which he is in the process of testing, however as a matter of procedure the instructions may provide for placing the range selector switch 53a through f in the first position for testing cables of relatively long length.

Thereupon, the testing circuit is activated to enable the capacitance measurements to be registered on meter 27. Assuming that there is no DC fault in the pair under test, that is a direct current short or similar fault, a meter reading will be obtained which is in general proportional to the length of the cable. For convenience, the potentiometer 51 may be adjusted to establish a suitable reference or deflection level on meter 27 to serve as a reference value for subsequent determination of faults in other pairs. It is desirable in this regard that the reference level, that is the deflection level of meter 27 which registers the average level of charge on the conductor pairs, be set to at least half-scale of the meter so as to facilitate the reading of the meter for minor deflections which might otherwise be obscured for extreme meter readings at either the high or low end of the scale. It has been found that a suitable reference level is in the neighborhood of approximately 70 for a meter scale of 0 to 100.

If the craftsman discovers that the meter 27 cannot be adjusted to this midrange level, and it is apparent to him that the lack of meter deflection is due to a low capacitance on the cable being inspected then the range selector switch 53a – f may be rotated to increase the amplification of the charging signal. In this particular and preferred embodiment, the range selector switch 53 is provided with three successively higher stages of amplification corresponding to switch positions numbers two through four. The highest range position of this switch enables the apparatus to inspect conductor pairs in cable lengths as short as 500 feet.

Figure 3A:
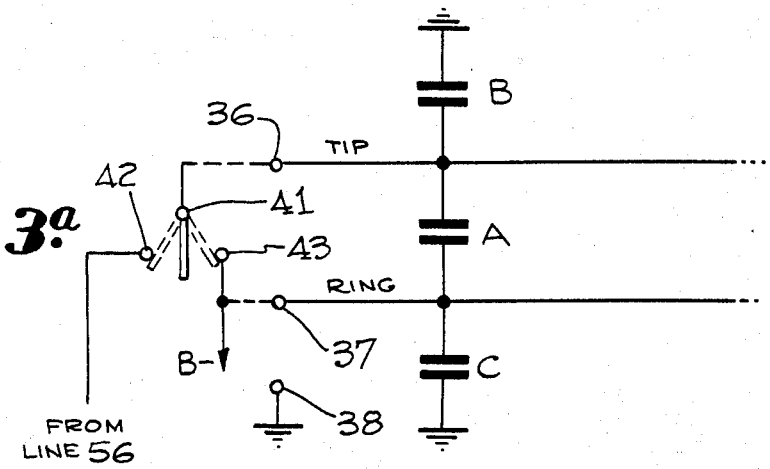
FIGS. 3a – 3c show the equivalent circuits for three of the principal test set-ups performed on each conductor pair by the apparatus of FIGS. 1 and 2.

As previously indicated, the instrument 11 provides a meter reading which is not intended to be an absolute measurement of the line capacitance but merely a means to indicate relative abnormalities or deviations in the distributed capacitance between each of the numerous cable pairs. Moreover, this relative capacitance measurement may be performed on the cable pairs in various ways in order to identify different types of faults. In FIG. 2 of the drawings, the contacts of relay 24 are shown by dotted lines to be connected in a particular manner to the tip and ring side of each cable pair. This, however, is but one of the several possible connections between the relay contacts and the cable conductors. With reference to FIG. 3a, this particular arrangement or connection of the relay contacts is illustrated in greater detail and with reference to the equivalent distributed capacitance associated with a given conductor pair. As shown in FIG. 3a, each pair of conductors exhibits a distributed capacitance A created by the capacitance between the adjacent wires as they stretch down the length of cable. In addition to this capacitance A, there exists two other distributed capacitance parameters, namely a capacitance B from the tip conductor to ground or, more particularly, to the metal sheath 21 of the cable and a further distributed capacitance C between the ring conductor and ground or sheath 21. With contacts 41, 42 and 43 of the relay connected as shown in FIG. 3a, corresponding to the dotted line connection shown in FIG. 2, the charging voltage is alternately applied across the tip and ring conductors through contacts 41 ad 42 and thereafter the lines are discharged through contacts 41 and 43. The capacitance which receives this periodic charging is provided by the sum of capacitance A in parallel with a series connection between capacitance B and C where the latter two capacitances are connected through the common sheath ground. Thus, all three of these distributed capacitances appear in the circuit during the charging-discharging operation performed by the test circuit of FIG. 2. Note that the ground terminal 38 from sheath 21 is not connected into the circuit in this instance. The resultant combination of capacitances A, B and C may be measured and compared for each of the cable pairs. If an abnormal deviaton appears in anyone or more of the cable pairs relative to the remaining good pairs, then this is one indication of a fault.

In addition to the foregoing test set-up, the usual testing procedure includes a very effective test operation referred to as a ratio test. This ratio test involves the comparison of a capacitance meter reading obtained on one side of a conductor pair with one of the distributed capacitances to ground being shorted out, relative to a capacitance meter reading obtained across both pairs in the manner shown in FIG. 3a. The one sided readings are obtained by the circuit connection shown in FIGS. 3b and 3c.

Figure 3B:
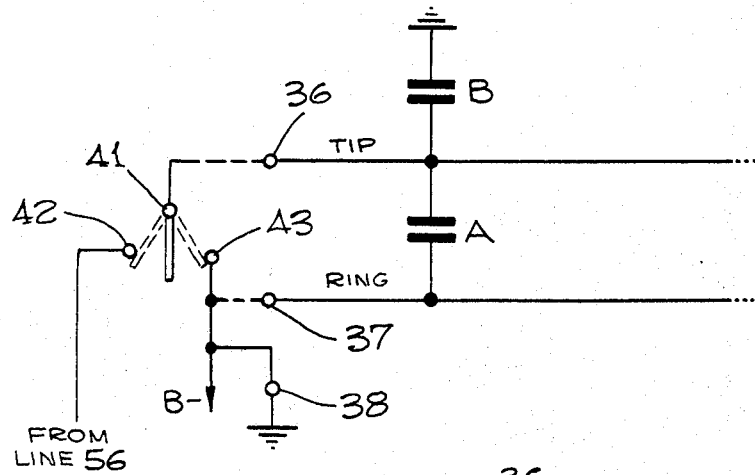

In FIG. 3b, the distributed capacitance C between the ring conductor and the ground or sheath is eliminated by connecting the sheath terminal 38 to the ring conductor 37 to short out the C capacitance. Accordingly, the only capacitances still in the circuit and available to assume the charge applied across the tip and ring conductors are the distributed capacitances A and B as illustrated.

Figure 3C:
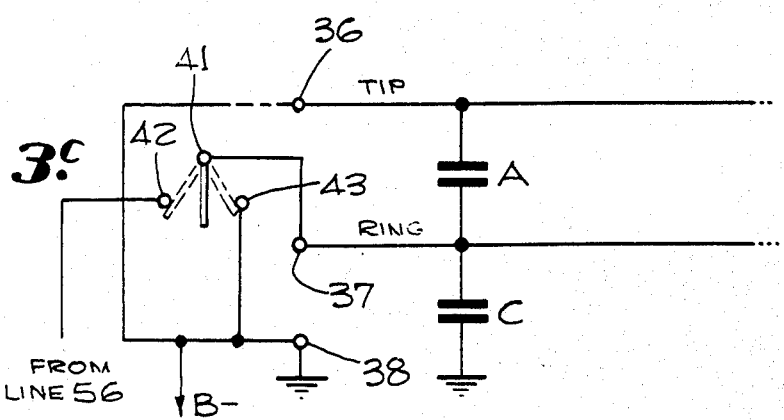

In FIG. 3c, the tip side of the line is connected to the ground or sheath 38 as shown so as to eliminate the distributed B capacitance. This leaves only capacitance A and C in the circuit for assuming the charge. By connecting the relay 24 in the various configurations shown in FIGS. 3a through 3c, it is possible to perform an effective ratio measurement for each cable pair. First, a ratio or comparison of meter readings is established between the FIG. 3b connection and the FIG. 3a connection, and thereafter a ratio is measured between the FIG. 3c configuration and again the FIG. 3a configuration and the ratios obtained from these two procedures are compared. The ratio on a good pair should not exceed the particular limits specified in standard charts available in the industry.

Although only a limited number of test operations have been described herein, it will be appreciated that the method and apparatus of the present invention may be utilized in performing a variety of different fault tests. For example, once a fault has been identified according to the foregoing testing operations, it is possible to locate the fault by utilizing the footage measurement capacitors 33. In such case, if an open or punchback has been identified, then the capacitance measurement obtained across the faulty pair may be matched to the footage capacitors 33 by adjusting the values of capacitors 33 and switching key switch 32 back and forth until a match is obtained on the reading of meter 27. Capacitors 33 may be calibrated in terms of feet such that the footage may be read directly off the dial settings which vary the value of the capacitors.

While only a particular embodiment of the present invention has been disclosed hereinabove, it will be readily apparent to persons skilled in the art that numerous changes and modifications may be made to the disclosed method and apparatus without departing from the spirit of the invention. Accordingly, the foregoing disclosure is to be considered illustrative only and does not in anyway limit the invention which is defined only by the following claims.

I claim:

1. An apparatus for detecting the existence of physical faults such as shorts, grounds, opens, crosses, splits, and punchbacks in a multiconductor cable having paired conductors exhibiting distributed capacitance, comprising:
   connector means for electrically connecting a plurality of pairs of conductors of said cable to said apparatus;
   switching means coupled to said connector means for sequentially selecting each said pair of conductors;
   a test circuit coupled to said switching means for testing the selected pair of conductors, said test circuit including means coupled to the selected pair of conductors for periodically electrically charging and discharging the distributed capacitance associated with said selected pair of conductors and means coupled to said means for periodically charging and discharging the distributed capacitance for selectively amplifying the periodically applied charge in accordance with the length of the cable under test; and
   said test circuit further including meter means coupled to said means for selectively amplifying the periodically applied charge for registering an average level of magnitude of charge on said pair of conductors wherein such average level is greater than zero charge and less than the peak value of charge assumed by the distributed capacitance of the cable pair, whereby meter readings for each of the plurality of pairs of conductors provides an indication of the existence and type of aforesaid fault.

2. The apparatus as set forth in claim 1, wherein said means for selectively amplifying the periodically applied charge includes a source of direct current potential and said means for periodically electrically charging and discharging the distributed capacitance includes a relay having an energizing coil and a set of contact means; said contact means connecting said direct current source to said pair of selected conductors through said meter means for alternately charging and discharging said pair of conductors depending upon the condition of said contact means; and said means for periodically electrically charging and discharging the distributed capacitance further includes timing circuit means coupled to said relay coil for periodically energizing said relay coil to cause said contact means to periodically alternate between the conditions of charging and discharging said pair of conductors.

3. The apparatus as defined in claim 2 further comprising a multipole-multiposition range selector switching means and an amplification circuit means; said range selector switching means being connected to said contact means of said relay and to said meter means and to said source of direct current potential and to said amplification circuit means for selectively charging said conductor pair through said relay contact means either directly from a voltage available from said source of direct current potential or an amplified voltage available after amplification of said direct current voltage by said amplification circuit means whereby said amplification circuit means provides said means for selectively amplifying the periodically applied charge and wherein the amount of such amplification is selected in accordance with the length of the cable under test.

4. The apparatus as defined in claim 1 and wherein said means for periodically charging and discharging the distributed capacitance includes;
   a timing circuit means, and
   a relay circuit means connected to said timing means and being periodically actuated thereby; and
   said means for selectively amplifying the periodically applied charge includes
   amplification circuit means,
   a source of battery potential, and
   range selector switching means connected to said battery potential and to said amplification circuit means and to said relay circuit means and to said meter means, said range selector means having a first position in which said cable pair is periodically charged and discharged by said battery potential through said relay means and said meter means for testing relatively long lengths of cable and having at least a second position for periodically charging said cable pair from an output of said amplification circuit means with the input thereof connected to said source of battery potential, whereby said amplification circuit means provides said means for selectively amplifying the periodically applied charge to increase the average level of magnitude of charge registered by said meter means for relatively short lengths of cable.

5. The apparatus as defined in claim 4, wherein said amplification circuit means includes:
   an operational amplifier connected in a non-inverting mode; and
   said range selector switching means in its second position connecting said relay circuit means to an input to said operational amplifier and connecting an output from said operational amplifier means through said meter means to a reference potential associated with said battery potential whereby the amplification provided across said operational amplifier serves to increase the charging voltage applied periodically by said relay circuit means to said cable pair through said meter means.

6. An apparatus of the type employed for detecting the existence of physical faults in a multiconductor cable having paired conductors exhibiting a capacitive effect at the terminations thereof wherein said apparatus includes a relay circuit means, a timing circuit means coupled to said relay circuit means for timing the operation of said relay circuit means, a meter means coupled to said relay circuit means and, a source of battery potential operatively coupled to said meter means to periodically charge and discharge each selected cable pair in accordance with the timing of said relay circuit means by said timing circuit means to cause an average reading on said meter means indicating the magnitude of the capacitance exhibited by the selected pair of conductors, the combination therewith comprising: an amplification circuit means and range selector switching means; said range selector switching means having a first position coupled to said meter means for connecting said battery potential substantially directly through said meter means and said relay means and for charging said selected pair of cable conductors, and having at least a second position for connecting said battery potential to said amplification circuit means and for connecting said relay means to the input of said amplification circuit means and said meter means to the output of said amplification circuit means so as to amplify the charging voltage periodically applied to the cable pair through said relay means in order to increase the average level of charging current registered by said meter means for relatively short lengths of cable.

7. A method of detecting the existence of physical faults such as shorts, grounds, opens, crosses, splits and punchbacks in a multiconductor cable composed of paired tip and ring conductors of a telephone transmission system comprising:

physically connecting a plurality of the pairs of tip and ring conductors to a test instrument;

selecting individual ones of said pairs of conductors for connection to a test circuit included in said test instrument;

periodically applying a voltage pulse across said selected tip and ring conductors;

measuring an average current flow through said tip and ring conductors caused by said periodic application of the voltage charging pulse; and selectively amplifying said average current flow through said tip and ring conductors as necessary to maintain a reference level of current flow at the selected conductor pair as the length of cable associated with such selected pair decreases with a commensurate decrease in the distributed capacitance associated therewith, whereby the measuring of the average current flow of the periodically applied and selectively amplified voltage pulse across the tip and ring conductors provides the detection of the physical faults.

* * * * *